United States Patent [19]
Inoue et al.

[11] Patent Number: 5,237,239
[45] Date of Patent: Aug. 17, 1993

[54] PIEZOELECTRIC ACTUATOR

[75] Inventors: Yoshiki Inoue; Kaneo Uehara; Atsushi Ochi, all of Tokyo, Japan

[73] Assignee: NEC Corporation, Tokyo, Japan

[21] Appl. No.: 772,333

[22] Filed: Oct. 7, 1991

[30] Foreign Application Priority Data

Oct. 5, 1990 [JP] Japan ................. 2-268939

[51] Int. Cl.⁵ ........................................... H01L 41/08
[52] U.S. Cl. ...................................... 310/328; 310/366
[58] Field of Search ..................... 310/328, 365, 366

[56] References Cited

U.S. PATENT DOCUMENTS

| | | | |
|---|---|---|---|
| 4,523,121 | 6/1985 | Takahashi et al. | 310/328 X |
| 5,089,739 | 2/1992 | Takahashi et al. | 310/328 |

FOREIGN PATENT DOCUMENTS

| | | | |
|---|---|---|---|
| 6039878 | 8/1983 | Japan | 310/366 |
| 58-196077 | 11/1983 | Japan . | |
| 0174681 | 8/1986 | Japan | 310/366 |
| 0095080 | 1/1991 | Japan | 310/328 |

Primary Examiner—Mark O. Budd
Attorney, Agent, or Firm—Leydig, Voit & Mayer

[57] ABSTRACT

In a piezoelectric actuator of the type which has a plurality of grooves on the outer side surface of the actuator body, mechanical reliability of the actuator is enhanced by providing grooves also in the respective layers of a material exhibiting electrostrictive effect located over and below the top and the bottom ends of the actuator. Moreover, a further improvement of mechanical strength can be attained by providing additional grooves onto the outer most grooves.

11 Claims, 7 Drawing Sheets

PIEZOELECTRIC ACTUATOR

BACKGROUND OF THE INVENTION

1. Field of the Invention

The present invention relates to a piezoelectric actuator, and more particularly, to a slit type piezoelectric actuator.

2. Description of Related Art

A piezoelectric actuator is a transducer which converts electric energy to mechanical energy by using the electrostrictive effect of a piezoelectric element.

More specifically, an electrostrictive effect element utilizes the strain generated in the piezoelectric element which exhibits a large electrostrictive effect, such as a lead magnesium niobate-lead titanate ceramic and a lead zirconate titanate ceramic, when an electrode made of a metal or the like is formed on each of two facing surfaces of the piezoelectric element, and a drive voltage is applied between the electrodes.

In the above-mentioned electrostrictive effect, the strain that is generated in the direction parallel to the applied electric field (longitudinal electrostrictive effect) is ordinarily about twice as large as the strain generated in the direction perpendicular to the electric field (lateral electrostrictive effect), so that it is advantageous to utilize the former, and the conversion efficiency from the electrical energy to the mechanical energy is also high.

In an piezoelectric actuator which utilizes the longitudinal electrostrictive effect (referred to as an actuator hereinafter), the amount of displacement per unit length of the actuator is substantially proportional to the intensity of the applied electric field.

Namely, in order to obtain a large amount of displacement it is necessary either to apply a high voltage between the opposing electrodes or to reduce the distance between the facing electrodes.

However, there is required a large-sized and an expensive power unit in order to apply a high voltage, and hazard in handling is also increased, so that it is more desirable to reduce the distance between the facing electrodes.

Heretofore, there is proposed a piezoelectric actuator having the laminated ceramic capacitor type structure to realize the actuator with smaller distance between the facing electrodes.

Figure 1A:
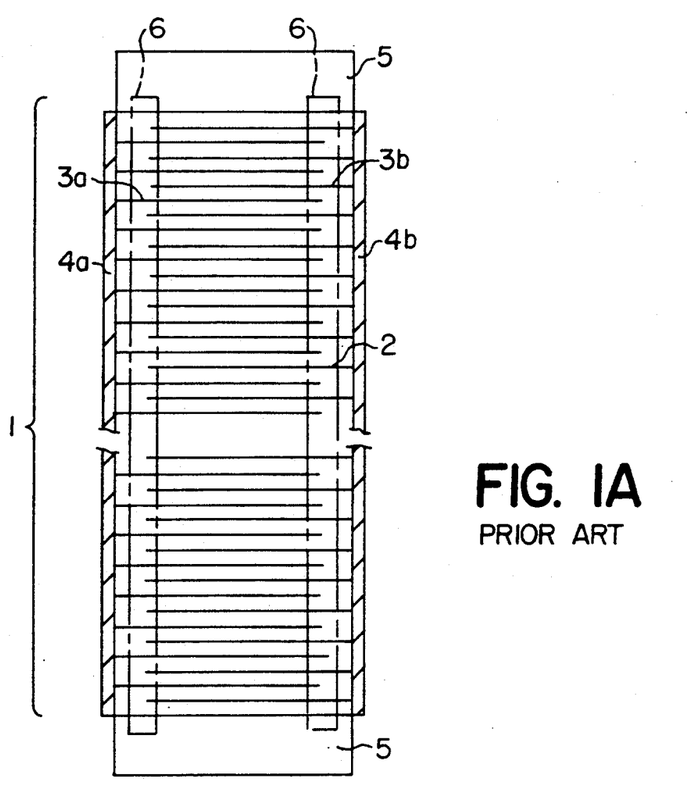
FIG. 1A and FIG. 1B are a longitudinal sectional view and a projected view, respectively, of showing the structure of a conventional piezoelectric actuator.
Figure 1B:
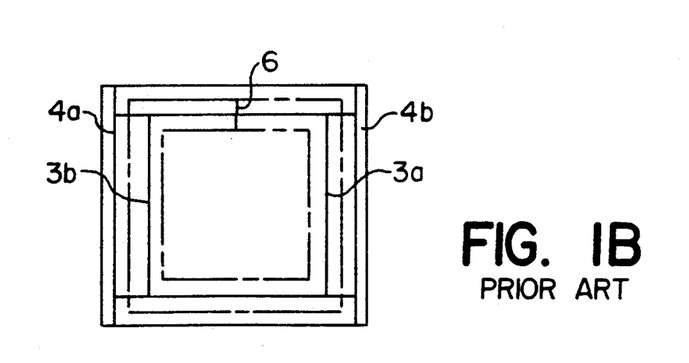

The structure of the actuator with the above-mentioned type is shown in FIG. 1A and FIG. 1B.

FIG. 1A is a cross-sectional view of the actuator taken in a plane parallel to the lamination direction of the element. In addition, FIG. 1B is a projected view of the actuator in the lamination direction thereof.

As shown in FIG. 1A, this actuator consists of a ceramic part where internal electrodes are provided in its interior with a specified spacing, and a ceramic part where no internal electrode is involved.

The ceramic part which has the internal electrodes in the interior is ordinarily called an active layer 1, and it is the part which contributes to the operation as an element by generating the longitudinal electrostrictive effect in the ceramic when a voltage is applied between the internal electrodes.

In the active layer 1, internal electrodes 3a and 3b are formed with a specified spacing in the interior of ceramic 2, alternately connected for every other layer to external electrodes 4a and 4b that are provided on the side face of the actuator, and the adjacent internal electrodes are mutually forming facing electrodes with a ceramic layer in between.

The distance between the internal electrodes can be made to have a minimum value of about 10 $\mu$m by means of the ordinary laminated ceramic capacitor technology.

On the other hand, the part which does not have in its interior the internal electrodes is ordinarily called an inactive layer 5, and it is the part which does not contribute to the operation of the actuator without showing the electrostrictive effect because of the absence of the internal electrodes for applying electric field therebetween. However, this part is necessary to prevent the fluctuation in the components of ceramic 2 of the active layer 1 at the time of high temperature heat treatment during the manufacturing process that will be described later.

By giving the above-mentioned laminated ceramic capacitor structure to the element it is possible to reduce the distance between the internal electrodes of the active layer 1. Therefore, it becomes possible to apply a high electric field to the electrostrictive material even with a low voltage, thereby realizing an element utilizing the longitudinal electrostrictive effect that can be operated at low voltages.

Now, in an actuator with the aforementioned structure the area where the internal electrodes overlap (the portion of the innermost rectangle in FIG. 1B) is small compared with the cross-sectional area of the actuator.

Because of this, when a large strain is generated in the part where the internal electrodes overlap by the application of a voltage to the actuator, there occurs a strong stress concentration in the boundary portion 6 between the part where the internal electrodes overlap and the part where they do not, and there may arise cases in which the actuator is mechanically broken if the applied voltage is high enough.

In order to improve such a defect of the conventional actuator, an actuator is proposed in which grooves (referred to as slits hereinafter) parallel to the internal electrodes are provided on the side face of the laminated ceramic capacitor type piezoelectric actuator.

Figure 2A:
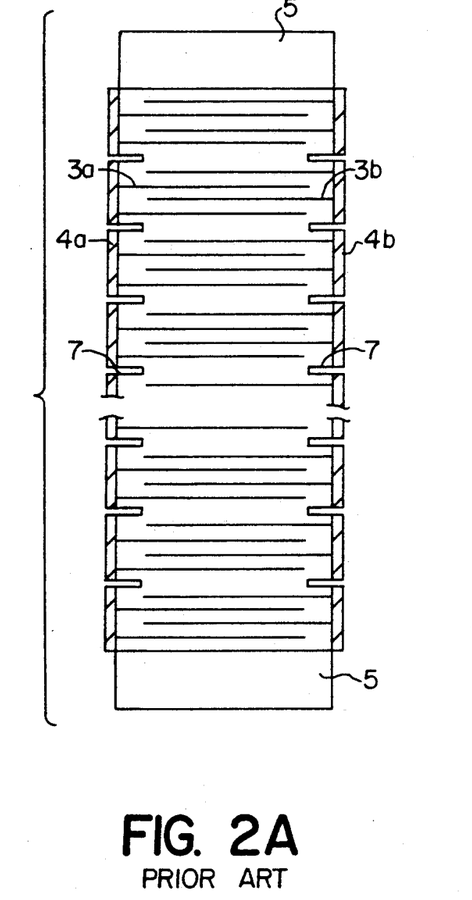
FIG. 2A and FIB. 2B are a longitudinal sectional view and a side elevation, respectively, showing the structure of a conventional slit type actuator.
Figure 2B:
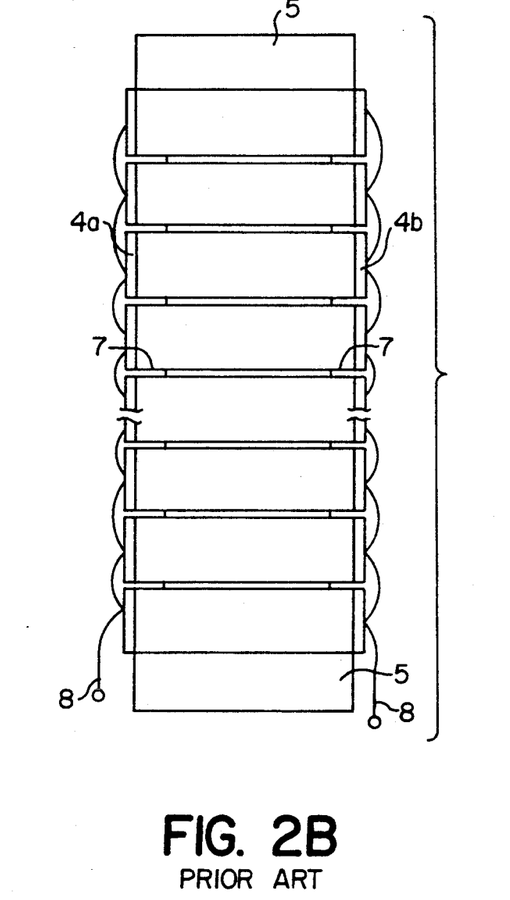

The actuator with this structure is disclosed in Japanese Patent Laid Open No. 58-196077, and its structure is shown in FIG. 2A and FIG. 2B. An actuator of this structure will be called a slit type actuator hereinafter.

FIG. 2A shows a sectional view in a plane parallel to the lamination direction of the slit type actuator, and FIG. 2B shows the side face of the slit type actuator where external electrodes are not formed.

In this slit type actuator, it is possible to prevent mechanical breakdown of the slit type actuator by dispersing and relaxing the concentration of stress at the time of generation of a displacement in the slit type actuator, by providing a plurality of slits that encircle the side face of the actuator in the parts where no overlap of the internal electrodes exists and hence no strain arises (namely, the portion of the ceramic between the external electrodes 4a and 4b, and the internal electrodes 3b and 3a).

As a result, it is possible to obtain a larger displacement since a voltage higher than for the conventional actuator becomes applicable.

Next, the manufacturing process of the slit type actuator will be described.

First, using the powder of a material that exhibits the electrostrictive effect, such as a lead magnesium niobate-lead titanate ceramic or a lead zirconate titanate ceramic, as the starting material, an organic solvent, a binder, and a plasticizer are added, and a slurry is prepared by stirring and mixing these ingredients.

Next, a ceramic green sheet is prepared from the slurry by doctor blade method or the like.

After drying the green sheet, a paste for internal electrodes having the powder of a silver-palladium alloy as the principal ingredient and a paste for slit forming material having carbon as the principal ingredient are printed over the green sheet by screen printing or the like.

Next, a ceramic laminated body is obtained by integration through stacking and thermocompression bonding.

By treating the ceramic laminated body at 600° C. in the air, the binder and the slit forming material are thermally decomposed and dispersed, and there are formed vacancies for the slits.

Subsequently, a ceramic sintered body having in its interior the vacancies for the slits is obtained by calcining the ceramic laminated body at a high temperature of about 1100° C. Then, the sintered body is cut, and after firing a silver paste for external electrodes on the two side faces where the internal electrodes are exposed, lead wires 8 for applying external voltage are connected, completing the slit type actuator.

Figure 3:
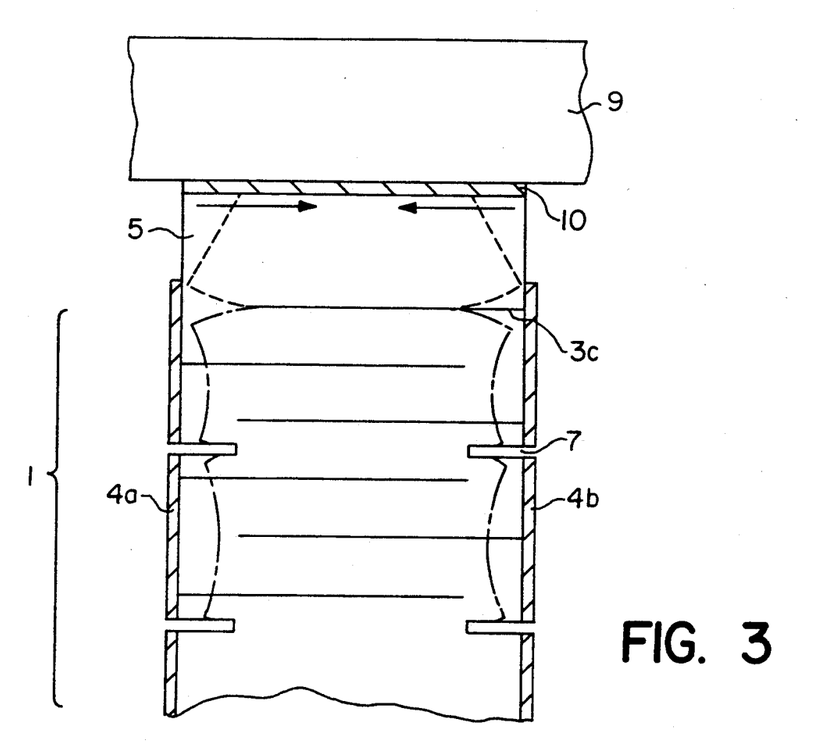
FIG. 3 is a diagram showing the state of bonding of the actuator to the metallic jig.

It is to be noted that in order to take out the displacement of the actuator to the outside in the actual use of the actuator, it is general to bond the top and the bottom end faces of the actuator to metallic jigs 9 using an adhesive 10 or the like to transfer the displacement in the actuator to the metallic jig 9, as shown in FIG. 3.

The prior art slit type actuator sometimes generates the following inconvenience in the course of its manufacturing process.

Figure 4:
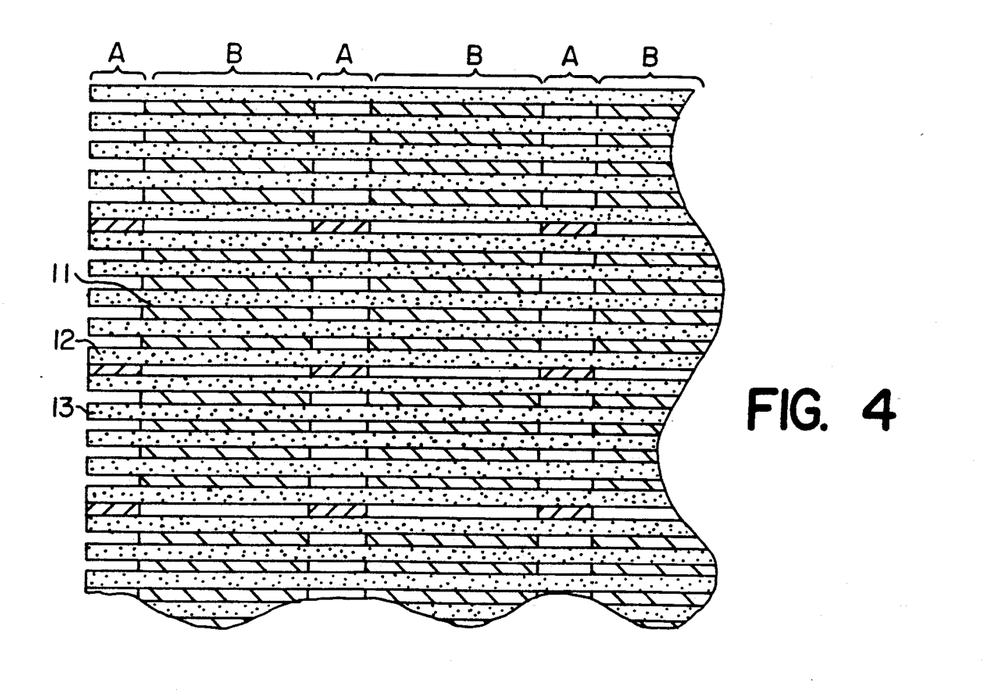
FIG. 4 is a sectional view showing the structure of a ceramic laminated body in the manufacturing process of the conventional slit type actuator.

FIG. 4 shows the state of affairs in the midst of the process for manufacturing a conventional slit type actuator, illustrating a sectional view of lamination of green sheets 13 with the patterns for the internal electrode paste 11 and for the slit forming material 12 being printed. It should be noted that FIG. 4 is drawn with the inactive layer part omitted.

In FIG. 4, the portion of the green sheet indicated as A has no internal electrodes printed, and there are laminated green sheets on which is printed the pattern for the slit forming member 12 alone on every fifth layer.

In contrast, the portion of the figure indicated as B, the pattern for the internal electrode paste alone is printed, and a large number of these layers are laminated.

In the figure, the alternate long and short dash line drawn in the portion where the slit forming materials are laminated (the portion indicated as A) shows the cutting position for segmenting the slit type actuator after sintering the ceramic laminated body.

Figure 5:
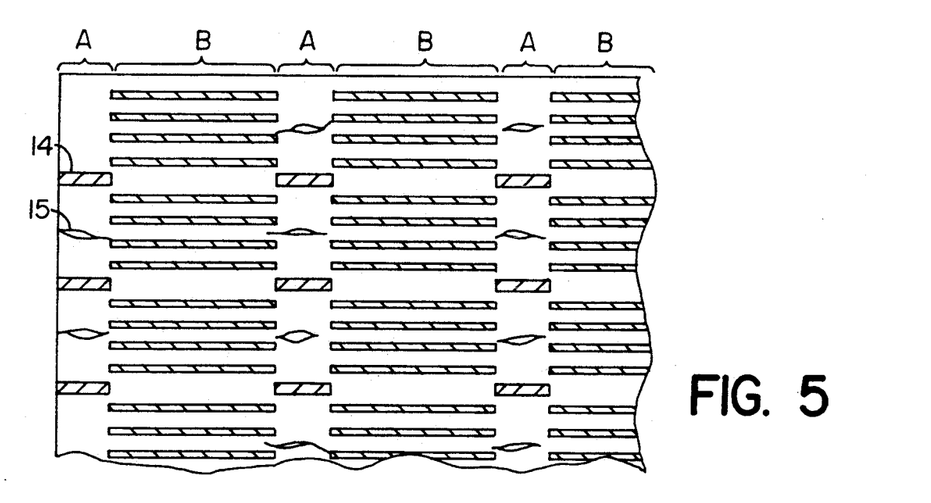
FIG. 5 is a sectional view showing the structure of a ceramic sintered body in the manufacturing process of the conventional slit type actuator.

FIG. 5 is a sectional view of the ceramic sintered body obtained by thermocompression bonding and calcining the ceramic laminated body. In addition to the integration of the whole system, the slit forming material is thermally decomposed and dispersed to form the vacancies 14 for the slits.

In FIG. 5, in the portion indicated as A, the number of layers with printed pattern is small so that the degree of application of the pressure at the time of the thermocompression bonding is weaker compared with the case for the part indicated as B.

Because of this, the amount of contraction at the time of sintering is greater for the portion A than for the portion B, generating a non-uniform contraction as a whole and making the generation of cracks in the portion A easier.

When such cracks 15 are generated, the mechanical strength of the slit type actuator segmented from the ceramic sintered body is reduced so that the element tends to be destroyed when a bending force is applied.

Furthermore, when large and deep cracks that reach even to the region between the facing internal electrodes are generated, the application of a voltage for the purpose of obtaining a displacement may lead to the breakdown of the actuator due to a discharge generated between the internal electrodes.

For this reason, with the conventional slit type actuator it is difficult to take out a large displacement by the application of a high voltage, so that the voltage to be applied had to be limited to low values.

Next, problems that can be generated in the use of the slit type actuator will be described.

As described in the above, to take out the displacement of the actuator to the outside it is ordinary, in general, to use the actuator by bonding its top and bottom end faces to metallic jigs 9 as shown in FIG. 3.

In that case, as the adhesive 10, use is made of a resin with high young's modulus so as not to absorb the displacement of the actuator, and it is general to use a thermosetting resin.

Accordingly, the bonding of the metallic jigs 9 to the actuator is carried out by cooling the heated state at 150° to 200° C. to the ordinary temperatures.

In this operation, the amount of contraction at cooling in the bonding process is larger for the metallic jig because the coefficient of thermal expansion of the metallic jig 9 is greater than the coefficient of expansion of the actuator.

Because of this, compressive forces as shown by the arrows in FIG. 3 is generated in the end face of the actuator, and as a result, the inactive layer 5 is deformed as shown by the broken line in the figure.

Further, the deformation of the actuator when a voltage is applied to the actuator in the above-mentioned actuator will be considered.

In FIG. 3, when a voltage is applied to the actuator, the active layer 1 is elongated in the direction of lamination due to the longitudinal electrostrictive effect and contracts in the direction perpendicular to the direction of lamination due to the lateral electrostrictive effect.

However, there will be generated no deformation in the inactive layer 5 so that the active layer 1 is urged to undergo a deformation as shown by the alternate long and short dash line in FIG. 3 (note that the elongation due to the longitudinal electrostrictive effect is not shown in the Figure).

Therefore as the combined effect of the two kinds of deformation there is generated a large tensile stress at the interface of the active layer 1 and the inactive layer 5, that is, at the part of the internal electrode 3a of the outermost layer.

However, the strength of the actuator against tension is weaker at the interface between the ceramic and the internal electrode than in the ceramic itself which is the electrostrictive material.

Accordingly, when a high voltage is applied to the actuator of this structure for the purpose of taking out a large displacement, mechanical breakdown tends to be generated at the interface of the internal electrode 3c of the outermost layer.

As is naturally expected, similar situation occurs also at the internal electrode of the outermost layer on the opposite side (namely, on the side of the bottom end of the actuator).

Although the description in the above has been made with reference to an ordinary actuator which is not of the slit type, similar phenomenon also takes place in the slit type actuator.

For this reason, in the conventional slit type element it is necessary to limit the voltage to be applied to lower values in order to prevent mechanical breakdown at the interface of the internal electrode of the outermost layer.

Summarizing the above, in the conventional slit type actuator, cracks tend to be generated in the course of the manufacturing process of the actuator, and moreover, a large tensile stress acts on the interface of the internal electrode of the outermost layer at the time of its use.

Because of this, the conventional slit type actuator has a defect in that it is necessary in its use to limit the applied voltage to a low level in order to prevent the dielectric breakdown between the internal electrodes and the external electrodes, and to prevent the mechanical breakdown of the actuator, so that it is difficult to take out a large displacement by the application of a high voltage.

SUMMARY OF THE INVENTION

Accordingly, it is an object of the present invention to provide a piezoelectric actuator which has a structure that can improve the aforementioned defect.

According to a first embodiment of the present invention, in a piezoelectric actuator of the type in which a layer of a material exhibiting an electrostrictive effect and a layer of internal electrode are alternately laminated, the respective internal electrodes are connected to the external electrodes in such a way that the adjacent internal electrodes mutually form facing electrodes, and grooves parallel to the internal electrodes are provided on the side face parallel to the lamination direction, the electrostrictive effect element according to the present invention is characterized in that the groove is provided on the outside, as seen in the direction of the lamination, of the outermost layer of the internal electrodes.

According to a second mode of the present invention, in a piezoelectric actuator of the type in which a layer of a material exhibiting an electrostrictive effect and a layer of internal electrode are alternately laminated, the respective internal electrodes are connected to the external electrodes in such a way that the adjacent internal electrodes mutually form facing electrodes, and grooves parallel to the internal electrodes are provided on the side face parallel to the lamination direction, the electrostrictive effect element according to the present invention is characterized in that the ends of the internal electrodes connected to one of the external electrodes are exposed to the two side faces where external electrodes are not formed.

BRIEF DESCRIPTION OF THE DRAWINGS

The above-mentioned and other objects, features, and advantages of this invention will become more apparent by reference to the following detailed description of the invention, wherein.

DESCRIPTION OF PREFERRED EMBODIMENTS

Figure 6A:
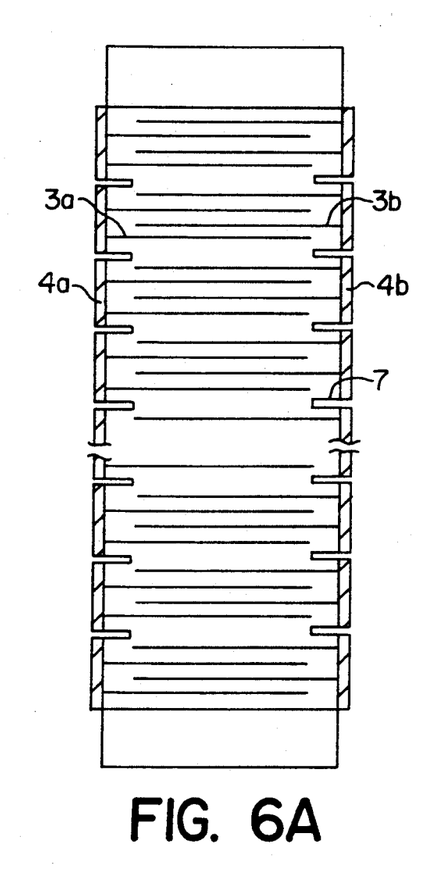
FIGS. 6A to 6C are a longitudinal sectional view, a side elevation, and a projected view, respectively, showing the structure of a first embodiment of the present invention.
Figure 6B:
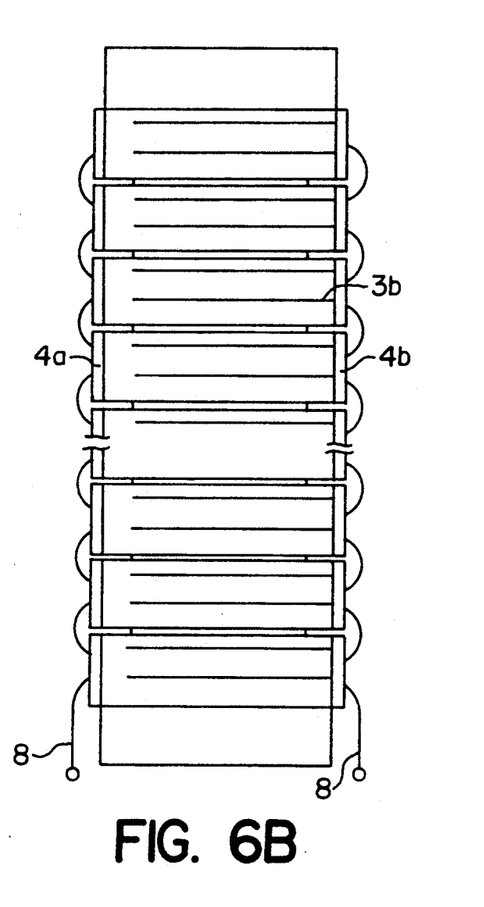
Figure 6C:
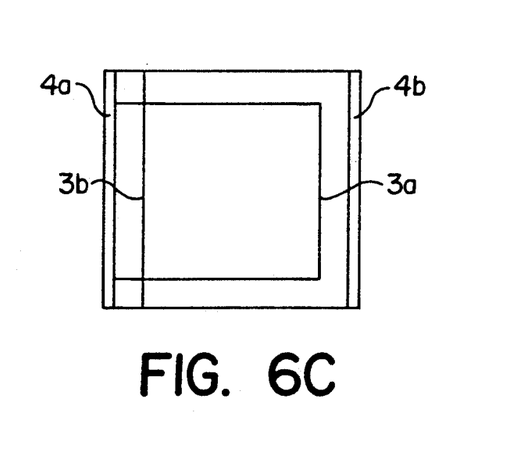

Referring to FIGS. 6A to 6C, the slit type element according to the present embodiment has a structure in which the internal electrodes 3b connected to the external electrodes 4b are exposed to both side faces where the external electrodes 4a and 4b are not provided.

In the present embodiment, the sectional area of the slit type actuator is set to be 4 mm×4 mm, the area of overlap of the internal electrodes 3a and 3b is set to be 3 mm×3 mm, and each slit is formed to a depth of 0.5 mm from the side face of the actuator into its interior.

The height of the slit type element is 10 mm, the mutual distance between the internal electrodes is 0.1 mm, and the distance between a slit and an internal electrode is 0.1 mm.

In what follows the manufacturing method of the first embodiment will be described.

The first embodiment uses an electrostrictive effect material of lead magnesium niobate-lead titanate system (0.9Pb(Mg$_{1/3}$ Nb$_{2/3}$) O$_3$—0.1Pb TiO$_3$) as the starting material, a predetermined quantities of an organic solvent, a binder, and a plasticizer are added to the calcined and pulverized powder of the starting material, and a slurry is prepared by stirring and mixing these ingredients.

The slurry is cast on a polyester film by the doctor blade method, and a green sheet with thickness of 130 μm is prepared.

After cutting the green sheet to a predetermined shape, a paste for internal electrodes having the powder of a silver-paladium alloy and a paste for slit forming material having carbon powder as the principal component are printed by application at predetermined positions by screen printing method.

A predetermined number of these green sheets are laminated in a predetermined order, and are formed into an integral body by thermocompression bonding.

Figure 7:
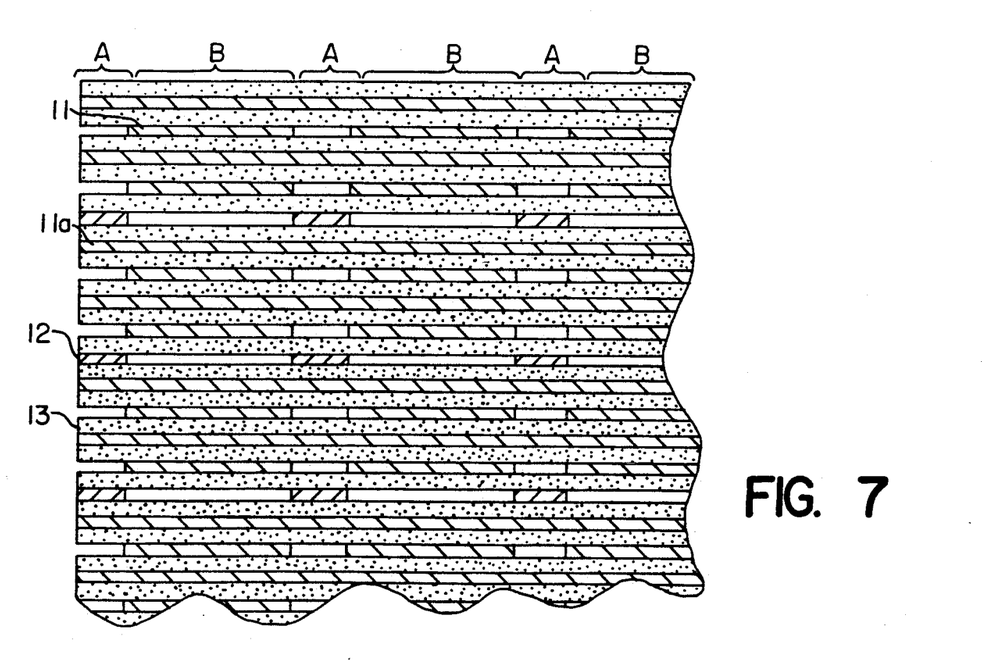
FIG. 7 is a sectional view showing the structure of a ceramic laminated body in the manufacturing process of the first embodiment of the present invention.

FIG. 7 is a sectional view of the ceramic laminated body in the present embodiment. It has a construction in which a pattern of an internal electrode paste 11a is formed for every other layer in a continued fashion.

Because of this, a uniform pressure is easy to be applied to the portions A and the portions B of the ceramic laminated body at the time of thermocompression bonding, compared with the conventional laminated body.

Next, the ceramic laminated body obtained as in the above is treated at 600° C. in the air, the binder and the slit forming material in the ceramic laminated body are removed by thermal decomposition, and a ceramic sintered body with internal vacancies is obtained by calcining it at 1100° C.

As mentioned above, according to the present embodiment there can be obtained a high quality ceramic sintered body with no generation of residual stress in the interior of the ceramic laminated body and suppressed generation of cracks during the calculation, because of the application of a uniform pressure all over at the time of thermocompression bonding and integration of the ceramic laminated body.

Finally, after cutting the ceramic laminated body at predetermined positions and applying and baking a silver paste for external electrodes on the two side faces where the internal electrodes are exposed, lead wires for voltage application are connected, completing the slit type actuator of the present embodiment.

Next, as a result of manufacturing 500 pieces each of the slit type actuators of the present embodiment obtainable as in the above, and the slit type actuator of the conventional structure, it was found that the percent defective of the former was 0% in contrast to the percent defective of 13% (65 pieces) of defective items with cracks for the latter.

It is to be noted that the result of displacement measurement at 150 V, after subjecting a slit type actuator according to the present embodiment and a slit type actuator of the conventional structure to a polarization treatment at 150 V DC for one minute, produced a value of 7.5 μm as the displacement for both kinds of actuators.

Next, the second embodiment of the present invention will be described.

Figure 8:
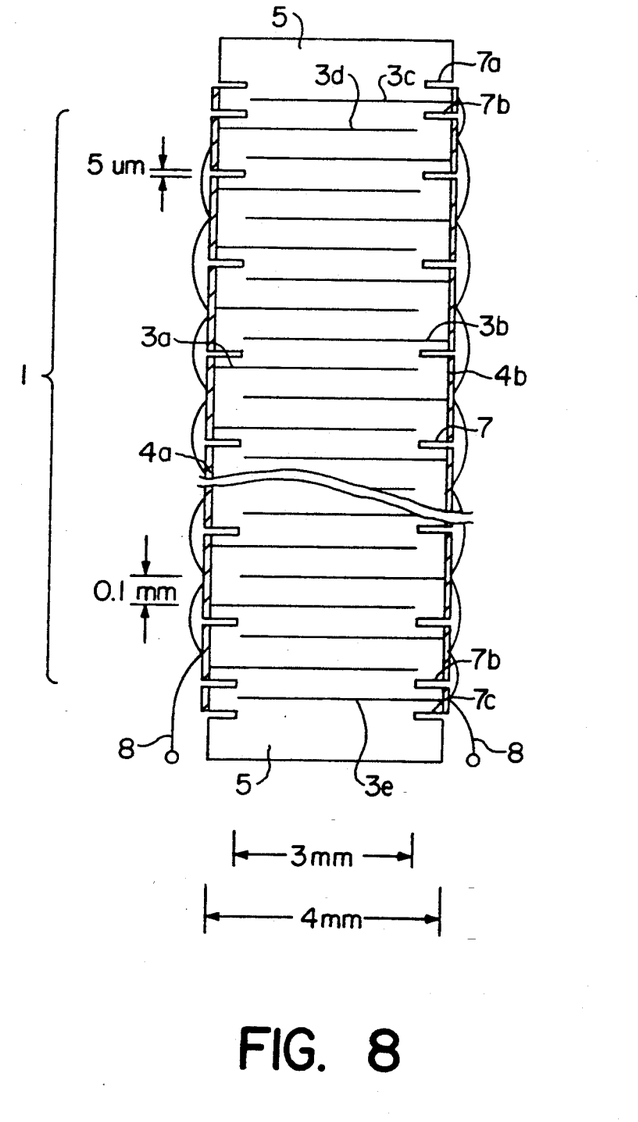
FIG. 8 is a longitudinal sectional view showing the more preferable structure of a second embodiment of the present invention.

FIG. 8 is a longitudinal sectional view showing the structure of the second embodiment of the slit type actuator of the present invention.

The structure of the slit type actuator of the present embodiment has a cross-sectional area of 4 mm×4 mm, the area for the overlapping portion of the lateral electrodes 3a and 3b, that is, the portion where a displacement is generated, of 3 mm×3 mm, and the distance between the internal electrodes of 0.1 mm.

In addition, each slit 7 has a depth from the surface of 0.5 mm, and a width in the lamination direction of 5 μm.

In the present embodiment, besides the above-mentioned structure, there are provided a slit 7a at the position 50 μm outside of the internal electrode 3c of the outermost layer, and a slit 7b at a position between the internal electrode 3c of the outermost layer and the adjacent internal electrode 3d.

Similarly, slits 7c and 7d are provided on both sides of the internal electrode 3e which is the outermost layer on the bottom end side of the actuator in the figure.

Hereinafter, the structure as described in the above will be referred to as Structure I.

The above-mentioned slit type actuator was manufactured under the identical process and conditions as for the first embodiment by selecting a lead zirconate titanate system ceramic as the electrostrictive effect material.

Further, the lamination method of the ceramic laminated body, namely, the printing pattern of the internal electrodes to the green sheet is made different from that of the first embodiment, and made the same as the lamination method for the conventional slit type actuator.

Figure 9:
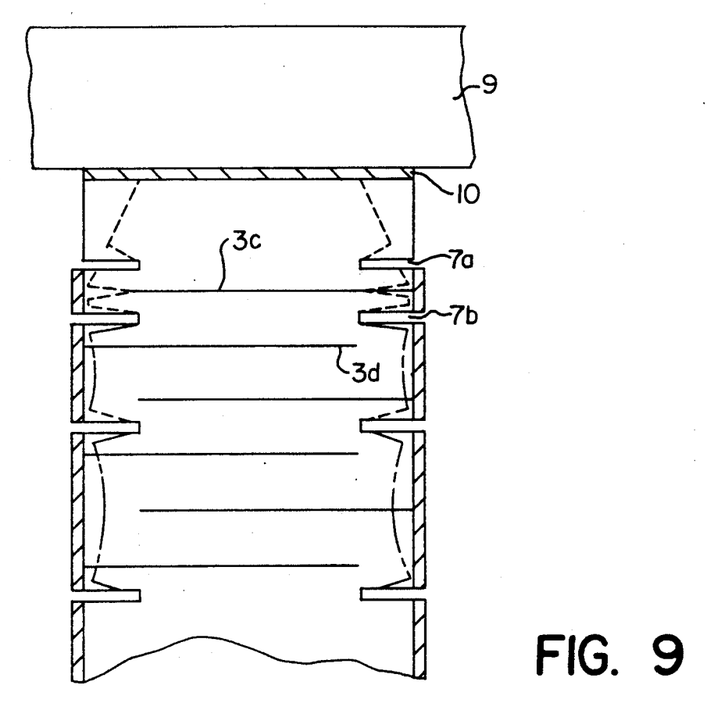
FIG. 9 is an enlarged partial sectional view for describing the deforming condition when the second embodiment of the present invention is bonded to a metallic jig and a voltage is applied.

In FIG. 9 is shown an enlarged partial view of a vertical section of the case when a slit type actuator of Structure I of the present embodiment is bonded to a metallic jig 9.

As can be seen from the figure, a slit 7a is provided on the further outside of the internal electrode 3c of the outermost layer. Further, a slit 7b is also provided between the internal electrode 3c of the outermost layer and the adjacent internal electrode 3d.

Of the tensile stress exerted on the interface of the internal electrode 3c the stress generated as a result of bonding to the metallic jig 9 (a force acting upward in FIG. 4) is relaxed by the presence of the slit 7a.

On the other hand, the stress which is generated as a result of applying a voltage to the slit type actuator (a force acting downward in FIG. 9) is relaxed by the presence of the slit 7b.

Because of these circumstances, mechanical breakdown at the interface of the internal electrode 3c of the outermost layer is made less likely to occur.

Next, in order to confirm the effect of the present invention, the top and the bottom ends of a slit type actuator obtained as in the above are bonded to stainless steel metallic jigs using an epoxy adhesive, and cured at 150° C.

On the other hand, for the purpose of comparison, a slit type actuator of the conventional structure in which the slits 7a, 7b, 7c, and 7d are devoid of the slit type actuator of the present embodiment was also subjected to a similar processing.

Subsequently, after giving a polarization treatment at 150 V DC for one minute for 20 pieces each of the respective kinds of the slit type actuator, the change in the displacement for the case of application of a voltage at a rate of voltage increase of 100 V/min (DC) was investigate for each kind.

Figure 10:
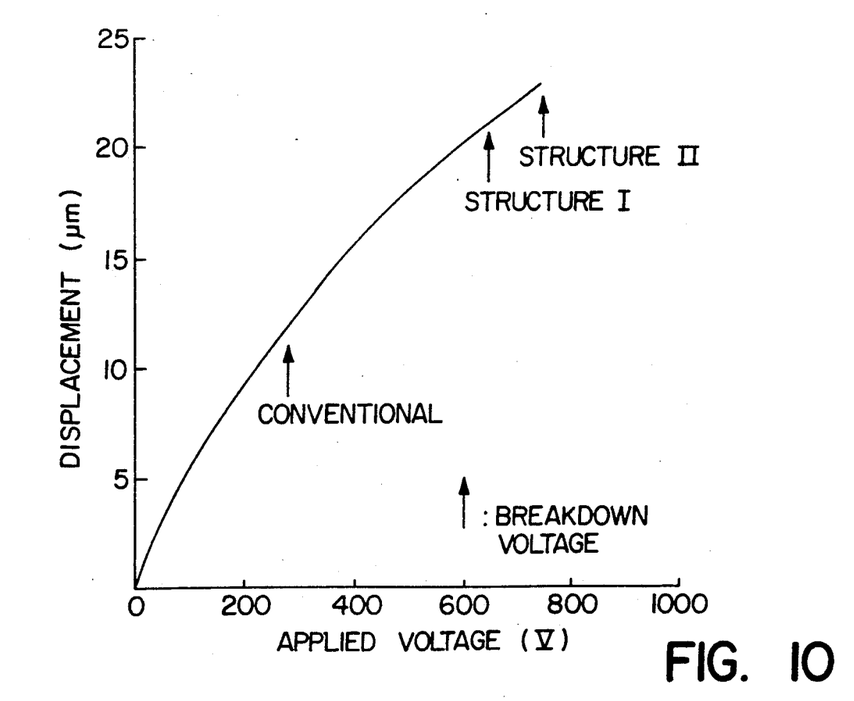
FIG. 10 is a chart representing the displacement characteristic for describing the effect of the second embodiment of the present invention.

The result of the test is shown in FIG. 10.

In contrast to the occurrence of mechanical breakdown in the range of 240 to 290 V for the conventional slit type actuator, the breakdown voltage was raised to the range of 620 to 690 V for the slit type actuator according to the present embodiment. As a result, a larger displacement was obtained for the slit type actuator of the present embodiment compared with the conventional slit type actuator.

Moreover, by manufacturing 20 pieces of a slit type actuator with a structure that has additionally one slit each at positions by 100 μm outside of the slits 7a and 7c of the slit type actuator of Structure I shown in FIG. 6 (referred to as Structure II hereinafter), a voltage was applied in the same way as for the slit type actuator of Structure I. In this case, the breakdown voltage was further enhanced to the range of 720 to 780 V as shown in FIG. 10.

This result is considered due to a further reduction, brought about by the increase in the number of slits provided, in the tensile stress generated at the interfaces of the internal electrodes of the outermost layers by the bonding of the actuator to the metallic jigs.

As in the above, according to the first mode of the present invention, a ceramic laminated body with no internal residual stress can be obtained, and a high quality ceramic sintered body with no internal creaks can be obtained by calcining the laminated body. Therefore, it is possible to manufacture with high yield a highly reliable slit type actuator which enables one to take out a large displacement by the application of a high voltage.

Moreover, according to the second mode of the present invention, in the slit type element it is possible to relax the tensile stress generated in the interface of the internal electrode of the outermost layer, at the time of application of a voltage by bonding metallic jigs for taking out the displacement, by providing slits at the positions further outside of the internal electrodes of the outermost layers, and providing slits between the internal electrodes of the outermost layers and the respective adjacent internal electrodes. Therefore, the breakdown voltage that leads to mechanical breakdown can be made higher, and hence a slit type actuator that enables one to take out a large displacement can be obtained.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A piezoelectric actuator comprising: a pillar of piezoelectric material having first and second end surfaces and side surfaces extending between the first and second end surfaces thereof, a first group of internal electrode layers embedded within said pillar, each of said first group of internal electrode layers being spaced apart from and parallel to each other and electrically connected to a first external electrode, a second group of internal electrode layers embedded within said pillar in parallel with and respectively sandwiched between said first group of internal electrode layers and commonly connected to a second external electrode, the first or second group of internal electrode layers including a first outermost internal electrode layer, and a plurality of grooves formed on said side surfaces so as to surround an elongated axis of said pillar, a first groove of said plurality of grooves being located between said first end surface and said first outermost internal electrode layer.

2. The piezoelectric actuator as claimed in claim 1, wherein said pillar has a rectangular shape having a first pair of opposed side surfaces and a second pair of opposed side surfaces, the first and second electrode being respectively disposed on opposite side surfaces of the first pair of opposed side surfaces, ends of said first and second group of internal electrode layers being respectively exposed each of the first side surfaces and respectively connected to said first and second external electrodes, and a pair of opposed ends of said first group of internal electrode layers being exposed at said second side surfaces.

3. The piezoelectric actuator as claimed in claim 1, further comprising an additional grove which is provided between said first groove and said first end surface.

4. The piezoelectric actuator as claimed in claim 1, including, a second groove of the plurality of grooves adjacent to the first groove and located between an internal electrode layer adjacent to the first outermost internal electrode layer and the first outermost internal electrode layer.

5. The piezoelectric actuator as claimed in claim 4, wherein the first or second group of internal electrode layers includies a second outermost internal electrode layer, the piezoelectric actuator including a third groove of the plurality of grooves being located between the second end surface and the second outermost internal electrode layer.

6. The piezoelectric actuator as claimed in claim 5, including a fourth groove of the plurality of grooves adjacent to the third groove and located between an internal electrode layer adjacent to the second outermost internal electrode layer and the second outermost internal electrode layer.

7. The piezoelectric actuator as claimed in claim 6, further comprising a pair of additional grooves which are respectively provided between the first and third grooves and the first and second end surfaces.

8. The piezoelectric actuator comprising: a plurality of electrostrictive effect layers, each of said electrostrictive effect layers having opposed principal surfaces, a plurality of internal electrode layers respectively sandwiched between said electrostrictive effect layers forming a laminated body of said electrostrictive effect layers and said internal electrode layers, said laminated body having first and second end surfaces and a side surface extending therebetween, two external electrodes alternately connected to said internal electrodes, and a plurality of grooves provided on said side surface of said laminated body such that each of said grooves extends along a direction parallel to said principal surfaces of said electrostrictive effect layers, a first groove of said plurality of grooves nearest to said first end surface being located between said first end surface and a first layer of said internal electrode layers nearest to said first end surface.

9. The piezoelectric actuator as claimed in claim 8, including a second groove of the plurality of groves adjacent to the first groove, being located between the first layer of internal electrode layers nearest to the first end surface and a second layer of the internal electrode layers nearest to the first layer of the internal electrode layers.

10. The piezoelectric actuator as claimed in claim 9, including a third groove of the plurality of grooves nearest to the second end surface being located between the second end surface and a third layer of the internal electrode layers nearest to the second end surface.

11. The piezoelectric actuator as claimed in claim 10, including a fourth groove of the plurality of grooves being located between the third layer of internal electrode layers and a fourth layer of the internal electrode layers nearest to the third layer of the internal electrode layers.

* * * * *